(12) United States Patent
Domeij et al.

(10) Patent No.: US 9,478,629 B2
(45) Date of Patent: Oct. 25, 2016

(54) CONDUCTIVITY MODULATION IN A SILICON CARBIDE BIPOLAR JUNCTION TRANSISTOR

(71) Applicant: Fairchild Semiconductor Corporation, San Jose, CA (US)

(72) Inventors: Martin Domeij, Sollentuna (SE); Benedetto Buono, Solna (SE)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 157 days.

(21) Appl. No.: 13/739,815

(22) Filed: Jan. 11, 2013

(65) Prior Publication Data

US 2013/0187173 A1    Jul. 25, 2013

Related U.S. Application Data

(63) Continuation of application No. PCT/EP2011/061635, filed on Jul. 8, 2011.

(60) Provisional application No. 61/364,307, filed on Jul. 14, 2010.

(30) Foreign Application Priority Data

Jul. 14, 2010   (SE) ..................... 1050789

(51) Int. Cl.
*H01L 29/66* (2006.01)
*H01L 29/10* (2006.01)
(Continued)

(52) U.S. Cl.
CPC ..... *H01L 29/66068* (2013.01); *H01L 29/1004* (2013.01); *H01L 29/1608* (2013.01); *H01L 29/73* (2013.01); *H01L 29/732* (2013.01)

(58) Field of Classification Search
CPC ................................. H01L 29/66068
USPC ........................................... 257/77
See application file for complete search history.

(56) References Cited

U.S. PATENT DOCUMENTS

| | | | |
|---|---|---|---|
| 7,297,626 B1 * | 11/2007 | Cole et al. | 438/602 |
| 2008/0157117 A1 | 7/2008 | McNutt et al. | |
| 2010/0117097 A1 * | 5/2010 | Domeij | 257/77 |

FOREIGN PATENT DOCUMENTS

| | | |
|---|---|---|
| EP | 0746040 A1 | 12/1996 |
| EP | 1806787 A1 | 7/2007 |
| WO | 2010/024240 A1 | 3/2010 |

OTHER PUBLICATIONS

Sharma, et al., "High-Voltage 4H-SiC Bipolar Junction Transistors With Epitaxial Regrowth of the Base Contact", IEEE Transactions on Electron Devices, vol. 55, No. 12, Dec. 2008, pp. 3360-3366.

(Continued)

*Primary Examiner* — Kenneth Parker
*Assistant Examiner* — Christopher Culbert
(74) *Attorney, Agent, or Firm* — Brake Hughes Bellerman LLP

(57) ABSTRACT

In one general aspect, a silicon carbide bipolar junction transistor (BJT) can include a collector region, a base region on the collector region, and an emitter region on the base region. The silicon carbide BJT can include a base contact electrically contacting the base region where the base region having an active part interfacing the emitter region. The silicon carbide BJT can also include an intermediate region of semiconductor material having at least a part extending from the active part of the base region to the base contact where the intermediate region having a doping level higher than a doping level of the active part of the base region.

20 Claims, 5 Drawing Sheets

(51) Int. Cl.
   *H01L 29/16*    (2006.01)
   *H01L 29/732*   (2006.01)
   *H01L 29/73*    (2006.01)

(56) References Cited

OTHER PUBLICATIONS

Domeij, et al., "High Current Gain Silicon Carbide Bipolar Power Transistors", Proceedings of the 18th International Symposium on Power Semiconductor Devices & IC's, Jun. 4-8, 2006, 4 pages.

Zhang, et al., "Demonstration of First 9.2 kV 4H-SiC Bipolar Junction Transistor", Electronics Letters, vol. 40, No. 21, Oct. 14, 2004, 2 pages.

Zhang, et al., "4H-SiC Bipolar Junction Transistors: From Research to Development—A case study: 1200 V, 20 A, Stable SiC BJTs with high blocking yield", 21st International Symposium on Power Semiconductor Devices & IC's, Jun. 14-18, 2009, pp. 339-342.

Zhang, et al., "Implantation-Free 4H-SiC Bipolar Junction Transistors With Double Base Epilayers", IEEE Electron Device Letters, vol. 29, No. 5, May 2008, pp. 471-473.

International Search Report received for PCT Patent Application No. PCT/EP2011/061635, mailed on Sep. 16, 2011, 5 pages.

Written Opinion of the International Searching Authority received for PCT Patent Application No. PCT/EP2011/061635, mailed on Sep. 16, 2011, 9 pages.

Demand and Response to Written Opinion filed for PCT Patent Application No. PCT/EP2011/061635 on May 8, 2012, 16 pages.

Written Opinion of the International Preliminary Examining Authority received for PCT Patent Application No. PCT/EP2011/061635, mailed on Aug. 14, 2012, 6 pages.

Response to Written Opinion of the International Preliminary Examining Authority filed for PCT Patent Application No. PCT/EP2011/061635 on Sep. 10, 2012, 8 pages.

International Preliminary Report on Patentability received for PCT Patent Application No. PCT/EP2011/061635, mailed on Oct. 30, 2012, 13 pages.

\* cited by examiner

CONDUCTIVITY MODULATION IN A SILICON CARBIDE BIPOLAR JUNCTION TRANSISTOR

RELATED APPLICATIONS

This application is a continuation of PCT Patent Application No. PCT/EP2011/061635, filed on Jul. 8, 2011, entitled, "Conductivity Modulation in a Silicon Carbide Bipolar Junction Transistor," which claims priority to and the benefit of U.S. Provisional Patent Application No. 61/364,307, filed Jul. 14, 2010, and which also claims priority to and the benefit of Swedish Application No. 1050789-5, filed Jul. 14, 2010, all of which are incorporated herein by reference their entireties.

TECHNICAL FIELD

This disclosure relates to the field of high power semiconductor devices such as silicon carbide bipolar junction transistors. In particular, the present disclosure relates to the manufacturing and/or designing of such devices with a controllable extent of conductivity modulation.

BACKGROUND

Power semiconductor devices are generally designed and fabricated to have as low power losses as possible during forward conduction and switching applications. The conduction power losses are normally directly proportional to the so-called forward voltage drop, which is the voltage that has to be supplied across the power device, in particular a blocking layer (as explained below) of the power device, to conduct a certain current. It is generally desirable to reduce the forward voltage drop of a power semiconductor device for reducing power losses.

Power semiconductor devices normally have a relatively thick and lowly doped region, referred to as blocking layer or even high voltage blocking layer. The thickness and the doping concentration of the blocking layer determine the breakdown voltage of the device, wherein an increase in thickness and/or a decrease in doping concentration increases the resulting breakdown voltage. The high voltage blocking layer contributes substantially to the forward voltage drop and thereby the power dissipation in the on-state of the power device (i.e. forward conduction).

In a silicon (Si) power device, the forward voltage drop may be reduced by conductivity modulation, wherein electrons and holes (negative and positive charge carriers, respectively) are injected into a high voltage blocking layer of the device and the resulting carrier plasma formed by the injected electrons and holes reduces the forward voltage drop.

A silicon carbide (SiC) power device can, thanks to the high critical field strength of SiC, have a relatively high doping concentration and thereby a relatively low resistivity in its high voltage blocking layer. Thus, many SiC power devices operate without conductivity modulation and have still rather low power losses. In particular, SiC bipolar junction transistors (BJTs) are useful as power switching transistors. A BJT comprises a collector, a base and an emitter wherein the collector and the emitter are usually made of a first type of semiconductor material, for example n-type, and the base is made of another type of semiconductor material, in the present example p-type. Generally, one of the figures of merit of a SiC BJT is its low forward voltage drop, referred herein to as the collector-emitter saturation voltage "$V_{CESAT}$".

However, for high power applications where voltages larger than 3 kV are required or even for other applications where, for example, an operation temperature of at least 200° C. and voltages larger than 1 kV are required, conductivity modulation in SiC devices would be beneficial for reducing power losses.

Due to the bipolar nature of a SiC BJT, conductivity modulation can be obtained in the collector region by a carrier plasma consisting of electrons and holes injected from the emitter and base regions. As a result, the series resistance of the collector region is reduced, thereby reducing the forward voltage drop $V_{CESAT}$. However, conductivity modulation presents also the drawback that the switching properties of the SiC BJT becomes slower because of the time required for building up and removing the carrier plasma during switching.

Thus, there is a need for providing methods and devices that would enable designing SiC BJTs while overcoming, or at least alleviating or mitigating, some of the above mentioned drawbacks.

SUMMARY

It is with respect to the above considerations that the present disclosure has been made.

Further, in at least some applications for SiC BJTs a trade-off between conduction and switching power losses is required and, thus, the extent of conductivity modulation in a SiC BJT would advantageously be controlled.

The present disclosure describes a method and a device where the extent of conductivity modulation in a SiC BJT can be controlled.

More specifically, the present disclosure describes a SiC BJT and a method of manufacturing such a SiC BJT such that power losses associated with conduction and switching are reduced.

Hence, according to a first aspect of the present disclosure, a method of manufacturing a SiC BJT is provided. The SiC BJT comprises a collector region, a base region and an emitter region. The method comprises the step of providing an intermediate region of semiconductor material arranged between the base-emitter junction and a contact zone for electrically contacting the base region. The base-emitter junction is formed by the base region and the emitter region. In this method, the extent of conductivity modulation in the collector region is determined by adjusting at least one parameter of the intermediate region affecting the diffusion current of minority carriers in the intermediate region.

According to a second aspect of the present disclosure, a SiC BJT is provided. The SiC BJT comprises a collector region, a base region and an emitter region. The SiC BJT further comprises an intermediate region of semiconductor material arranged between the base-emitter junction and a contact zone for electrically contacting the base region. The base-emitter junction is formed by the base region and the emitter region. In this BJT, at least one parameter of the intermediate region affecting the diffusion current of minority carriers in the intermediate region is configured to determine the extent of conductivity modulation in the collector region.

The present disclosure makes use of an understanding that the extent of conductivity modulation in the collector region of a SiC BJT can be determined by providing an intermediate region of semiconductor material between the base-emitter junction and the contact zone for electrically contacting the base region (also called the base contact in the following) and by adjusting at least one parameter of the intermediate region affecting the diffusion of minority carriers from the base-emitter junction to the base contact. The part (also can be referred to as a portion) of the base region used to form the base-emitter junction, i.e. the part of the base region interfacing the emitter region (i.e. the part of the base region involved in the basic (or main) operation of the BJT), may be referred to as the active part or the intrinsic part of the base region, the remaining part of the base region being referred to as the passive part or extrinsic part. In the present disclosure, the intermediate region is arranged in the passive part of the base region, i.e. the region located between an edge of the base-emitter junction and an edge of the base contact.

According to the present disclosure, at least one parameter of the intermediate region is adjusted or configured such that the diffusion current of minority carriers from the active part of the base region to the base contact is controlled, thereby determining the injection of carriers in the collector region under forward bias conditions and thus the extent of conductivity modulation in the collector region. For example, referring to a NPN BJT wherein the collector and the emitter regions are made of n-type SiC and the base region is made of p-type SiC, the intermediate region is configured to reduce extraction of electrons from the active part of the base region to the base contact, thereby increasing the electron injection from the emitter region into the collector region and, thus, increasing the amount of conductivity modulation in the collector region, or vice versa. Indeed, carrier recombination at the base contact (e.g. in the ohmic contact or layer arranged underneath the base contact) may be so high that the concentration of minority carrier at the base contact interface reaches its equilibrium value, which could be assumed to be negligible (i.e. approximated by zero) as compared to the minority carrier concentration in the intermediate region. The gradient of minority carrier concentration in the intermediate region (along a direction from the base-emitter junction to the base contact) is responsible for the extraction of minority carriers from the active part of the base region to the base contact and, thus, for the extent of conductivity modulation. The diffusion current of the minority carriers in the intermediate region can be controlled by adjusting physical parameters of the intermediate region.

Embodiments of the present disclosure are advantageous in that the extent of conductivity modulation can be determined (controlled) in a SiC BJT. In particular, the present disclosure is advantageous in that it provides a method for fabricating a SiC BJT with enhanced conductivity modulation in the collector region and thereby a reduced forward voltage drop $V_{CESAT}$ under normal operating conditions.

Further, aspects of the present disclosure are advantageous in that it at least establishes how the extent of conductivity modulation can be determined in a SiC BJT. More specifically, the present disclosure establishes which region in the design of a SiC BJT determines the extent of conductivity modulation.

Further, aspects of the present disclosure are advantageous in that it provides the possibility of reducing the conduction power losses at high collector currents. The present disclosure may be particularly useful for reducing power dissipation during (limited) periods of overcurrent conditions, thereby reducing the (maximum) device temperature and improving the device robustness.

Further, aspects of the present disclosure are advantageous in that it provides a method of manufacturing a SiC BJT and a SiC BJT wherein an improved tradeoff between conduction and switching power losses is obtained. More specifically, as the present disclosure provides a SiC BJT with controllable extent of conductivity modulation, if conductivity modulation in the BJT is increased then power losses associated with conduction under forward conditions are reduced while those associated with switching are increased, and vice versa.

According to an embodiment, a (physical) parameter of the intermediate region affecting the diffusion current of minority carriers may be the size of the intermediate region, which size corresponds to the distance between an edge of the base-emitter junction and an edge of the contact zone for electrically contacting the base region. The present embodiment is advantageous in that it at least establishes which specific parameter of the intermediate region can determine the extent of conductivity modulation in the collector region of the BJT. In particular, it has been recognized that the gradient of minority carrier concentration in the intermediate region and, thus, the diffusion current of the minority carriers is proportional to the distance between the emitter edge and the base contact (assuming that surface recombination or bulk recombination are not sufficiently large to significantly reduce the diffusion length). For example, it is envisaged that the diffusion current of minority carriers can be reduced by increasing the distance between the base-emitter junction and the base contact (i.e. increasing the size of the intermediate region), thereby reducing the extraction of minority carriers from the active part of the base region to the base contact and, thus, increasing the amount of conductivity modulation.

Advantageously, the distance between the base-emitter junction and the contact zone for electrically contacting the base region may be at least 5 micrometers in order to provide some conductivity modulation in the collector region of the BJT (and still maintain efficient switching properties). Depending on the intended application and in particular the targeted tradeoff between power losses associated with conduction and switching, it is envisaged to design SiC BJTs with intermediate regions providing larger distances than 5 micrometers between the base-emitter junction and the contact zone, for example in the range of 6-20 micrometers, and preferably in the range of 8-15 micrometers, in order to obtain a sufficient extent of conductivity modulation.

According to another embodiment, a (physical) parameter affecting the diffusion current of minority carriers may be the doping level of the semiconductor material of the intermediate region, which is advantageous in that an increased doping level (or doping concentration) in the intermediate region (the extrinsic part of the base region) reduces the concentration of minority carrier in this part of the base region (the concentration of minority carrier being proportional to the square of the intrinsic carrier concentration divided with the local concentration of the majority carriers) and thereby reduce the diffusion current of minority carriers, and vice versa.

In particular, the doping level of the semiconductor material of the intermediate region may be at least $1 \times 10^{18}$ cm$^3$. Depending on the intended application and in particular the targeted tradeoff between power losses associated with conduction and switching, it is envisaged to design SiC BJT wherein the doping level in the intermediate region is larger than $1 \times 10^{18}$ cm$^{-3}$, for example in the range of $5 \times 10^{18}$ cm$^{-3}$ to $1 \times 10^{20}$ cm$^{-3}$, and preferably about $1 \times 10^{19}$ cm$^{-3}$.

Although the control or determination of the extent of conductivity modulation in the BJT has been described in the above separately by either adjusting the size of the intermediate region (and thereby the distance between the base-emitter junction and the base contact) or by adjusting the doping level of the intermediate region, it is also envisaged that the extent of conductivity modulation can be determined by an adjustment of both parameters. In other words, although two detailed design concepts have been described for determining the extent of conductivity modulation, a combination of these two design concepts is also envisaged. A combination of the two design concepts may be advantageous since an adjustment (e.g. an increase) of the size of the intermediate region (distance between the base-emitter junction and the base contact) affects the so-called cell pitch of the SiC BJT, i.e. the density of SiC BJT cells (which for an increase of the distance decreases). The two design concepts may therefore be combined to obtain a desired tradeoff (preferably the optimal tradeoff) between extent of conductivity modulation and cell pitch of the SiC BJT.

Referring now in particular to the method of manufacturing a SiC BJT according to the first aspect of the present disclosure, the intermediate region may be formed according to the following processing procedure. At least part of the base region located in the passive part of the base region may be removed and a layer of semiconductor material (from which the intermediate region is to be made) may be provided on top of the BJT. Then, the layer of semiconductor material provided on top of the emitter region is removed. As a result, the passive part of the base region is replaced by the newly provided semiconductor layer, i.e. the intermediate region. The doping level and the size of the intermediate region may be adapted to the intended application of the SiC BJT.

Alternatively, the intermediate region may be formed by providing a layer of semiconductor material on top of the collector region and removing the layer of semiconductor material at a location corresponding to the active part of the base region and the emitter region. Further details about these two alternatives will be described in the following description.

In the SiC BJT, the intermediate region is arranged to replace a part of the passive region of the base layer. The intermediate region extends vertically from the surface of the base layer towards the collector region. Thus, in for instance the embodiment based on adjustment of the doping level of the intermediate region to e.g. at least $1 \times 10^{18}$ cm$^{-3}$, the doping level of the semiconductor material at the surface of the passive region of the base layer (i.e. at the level of the emitter-base junction) is at least $1 \times 10^{18}$ cm$^{-3}$.

Generally, in the present application, effects and features associated with the SiC BJT as defined in accordance with the second aspect of the present disclosure and its embodiments are largely analogous to those described in connection with the method according to the first aspect of the present disclosure. It will therefore be appreciated that any features in embodiments described with reference to the method according to the first aspect of the disclosure can be combined with the SiC BJT according to the second aspect of the disclosure and, vice versa, to create embodiments other than those described herein.

Further features of, and advantages with, the present disclosure will become apparent when studying the following detailed disclosure, the drawings and the appended claims. It will be appreciated that different features of the present disclosure can be combined to create embodiments other than those described in the following.

BRIEF DESCRIPTION OF THE DRAWINGS

The above, as well as additional features and advantages of the present disclosure, will be better understood through the following illustrative and non-limiting detailed description of preferred embodiments of the present disclosure, with reference to the appended drawings, in which FIG. 1 schematically shows a cross-section of a SiC BJT comprising an intermediate region in accordance with an embodiment.

Figure 1:
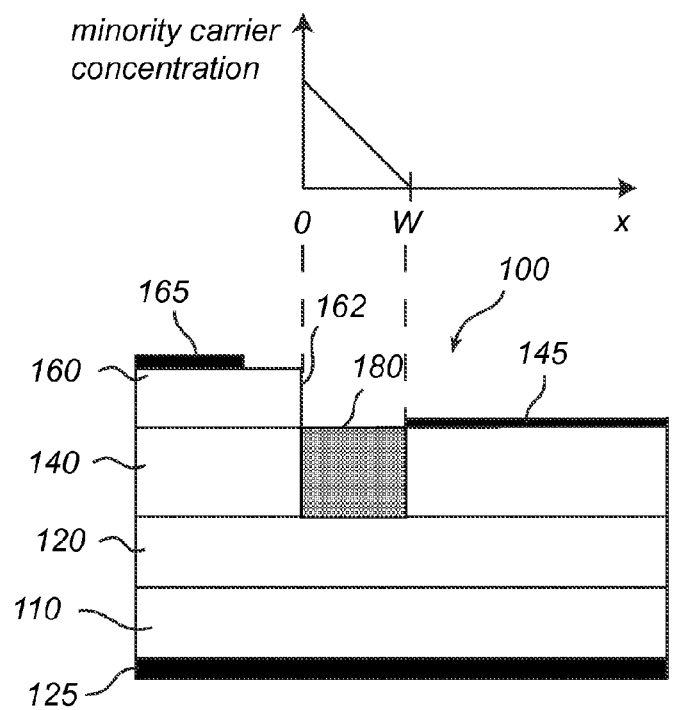

At least some of the figures are schematic, not necessary to scale, and generally may only show some parts, wherein other parts may be omitted or merely suggested.

DETAILED DESCRIPTION

The present disclosure describes a method and a device where the extent of conductivity modulation in a SiC BJT can be controlled.

More specifically, the present disclosure describes a SiC BJT and a method of manufacturing such a SiC BJT such that power losses associated with conduction and switching are reduced.

Hence, according to a first aspect of the present disclosure, a method of manufacturing a SiC BJT is provided. The SiC BJT comprises a collector region, a base region and an emitter region. The method comprises the step of providing an intermediate region of semiconductor material arranged between the base-emitter junction and a contact zone for electrically contacting the base region. The base-emitter junction is formed by the base region and the emitter region. In this method, the extent of conductivity modulation in the collector region is determined by adjusting at least one parameter of the intermediate region affecting the diffusion current of minority carriers in the intermediate region.

According to a second aspect of the present disclosure, a SiC BJT is provided. The SiC BJT comprises a collector region, a base region and an emitter region. The SiC BJT further comprises an intermediate region of semiconductor material arranged between the base-emitter junction and a contact zone for electrically contacting the base region. The base-emitter junction is formed by the base region and the emitter region. In this BJT, at least one parameter of the intermediate region affecting the diffusion current of minority carriers in the intermediate region is configured to determine the extent of conductivity modulation in the collector region.

The present disclosure makes use of an understanding that the extent of conductivity modulation in the collector region of a SiC BJT can be determined by providing an intermediate region of semiconductor material between the base-emitter junction and the contact zone for electrically contacting the base region (also called the base contact in the following) and by adjusting at least one parameter of the intermediate region affecting the diffusion of minority carriers from the base-emitter junction to the base contact. The part (also can be referred to as a portion) of the base region used to form the base-emitter junction, i.e. the part of the base region interfacing the emitter region (i.e. the part of the base region involved in the basic (or main) operation of the BJT), may be referred to as the active part or the intrinsic part of the base region, the remaining part of the base region being referred to as the passive part or extrinsic part. In the present disclosure, the intermediate region is arranged in the passive part of the base region, i.e. the region located between an edge of the base-emitter junction and an edge of the base contact.

According to the present disclosure, at least one parameter of the intermediate region is adjusted or configured such that the diffusion current of minority carriers from the active part of the base region to the base contact is controlled, thereby determining the injection of carriers in the collector region under forward bias conditions and thus the extent of conductivity modulation in the collector region. For example, referring to a NPN BJT wherein the collector and the emitter regions are made of n-type SiC and the base region is made of p-type SiC, the intermediate region is configured to reduce extraction of electrons from the active part of the base region to the base contact, thereby increasing the electron injection from the emitter region into the collector region and, thus, increasing the amount of conductivity modulation in the collector region, or vice versa. Indeed, carrier recombination at the base contact (e.g. in the ohmic contact or layer arranged underneath the base contact) may be so high that the concentration of minority carrier at the base contact interface reaches its equilibrium value, which could be assumed to be negligible (i.e. approximated by zero) as compared to the minority carrier concentration in the intermediate region. The gradient of minority carrier concentration in the intermediate region (along a direction from the base-emitter junction to the base contact) is responsible for the extraction of minority carriers from the active part of the base region to the base contact and, thus, for the extent of conductivity modulation. The diffusion current of the minority carriers in the intermediate region can be controlled by adjusting physical parameters of the intermediate region.

Embodiments of the present disclosure are advantageous in that the extent of conductivity modulation can be determined (controlled) in a SiC BJT. In particular, the present disclosure is advantageous in that it provides a method for fabricating a SiC BJT with enhanced conductivity modulation in the collector region and thereby a reduced forward voltage drop $V_{CESAT}$ under normal operating conditions.

Further, aspects of the present disclosure are advantageous in that it at least establishes how the extent of conductivity modulation can be determined in a SiC BJT. More specifically, the present disclosure establishes which region in the design of a SiC BJT determines the extent of conductivity modulation.

Further, aspects of the present disclosure are advantageous in that it provides the possibility of reducing the conduction power losses at high collector currents. The present disclosure may be particularly useful for reducing power dissipation during (limited) periods of overcurrent conditions, thereby reducing the (maximum) device temperature and improving the device robustness.

Further, aspects of the present disclosure are advantageous in that it provides a method of manufacturing a SiC BJT and a SiC BJT wherein an improved tradeoff between conduction and switching power losses is obtained. More specifically, as the present disclosure provides a SiC BJT with controllable extent of conductivity modulation, if conductivity modulation in the BJT is increased then power losses associated with conduction under forward conditions are reduced while those associated with switching are increased, and vice versa.

According to an embodiment, a (physical) parameter of the intermediate region affecting the diffusion current of minority carriers may be the size of the intermediate region, which size corresponds to the distance between an edge of the base-emitter junction and an edge of the contact zone for electrically contacting the base region. The present embodiment is advantageous in that it at least establishes which specific parameter of the intermediate region can determine the extent of conductivity modulation in the collector region of the BJT. In particular, it has been recognized that the gradient of minority carrier concentration in the intermediate region and, thus, the diffusion current of the minority carriers is proportional to the distance between the emitter edge and the base contact (assuming that surface recombination or bulk recombination are not sufficiently large to significantly reduce the diffusion length). For example, it is envisaged that the diffusion current of minority carriers can be reduced by increasing the distance between the base-emitter junction and the base contact (i.e. increasing the size of the intermediate region), thereby reducing the extraction of minority carriers from the active part of the base region to the base contact and, thus, increasing the amount of conductivity modulation.

Advantageously, the distance between the base-emitter junction and the contact zone for electrically contacting the base region may be at least 5 micrometers in order to provide some conductivity modulation in the collector region of the BJT (and still maintain efficient switching properties). Depending on the intended application and in particular the targeted tradeoff between power losses associated with conduction and switching, it is envisaged to design SiC BJTs with intermediate regions providing larger distances than 5 micrometers between the base-emitter junction and the contact zone, for example in the range of 6-20 micrometers, and preferably in the range of 8-15 micrometers, in order to obtain a sufficient extent of conductivity modulation.

According to another embodiment, a (physical) parameter affecting the diffusion current of minority carriers may be the doping level of the semiconductor material of the intermediate region, which is advantageous in that an increased doping level (or doping concentration) in the intermediate region (the extrinsic part of the base region) reduces the concentration of minority carrier in this part of the base region (the concentration of minority carrier being proportional to the square of the intrinsic carrier concentration divided with the local concentration of the majority carriers) and thereby reduce the diffusion current of minority carriers, and vice versa.

In particular, the doping level of the semiconductor material of the intermediate region may be at least $1 \times 10^{18}$ cm$^{-3}$. Depending on the intended application and in particular the targeted tradeoff between power losses associated with conduction and switching, it is envisaged to design SiC BJT wherein the doping level in the intermediate region is larger than $1 \times 10^{18}$ cm$^{-3}$, for example in the range of $5 \times 10^{18}$ cm$^{-3}$ to $1 \times 10^{20}$ cm$^{-3}$, and preferably about $1 \times 10^{19}$ cm$^{-3}$.

Although the control or determination of the extent of conductivity modulation in the BJT has been described in the above separately by either adjusting the size of the intermediate region (and thereby the distance between the base-emitter junction and the base contact) or by adjusting the doping level of the intermediate region, it is also envisaged that the extent of conductivity modulation can be determined by an adjustment of both parameters. In other words, although two detailed design concepts have been described for determining the extent of conductivity modulation, a combination of these two design concepts is also envisaged. A combination of the two design concepts may be advantageous since an adjustment (e.g. an increase) of the size of the intermediate region (distance between the base-emitter junction and the base contact) affects the so-called cell pitch of the SiC BJT, i.e. the density of SiC BJT cells (which for an increase of the distance decreases). The two design concepts may therefore be combined to obtain a desired tradeoff (preferably the optimal tradeoff) between extent of conductivity modulation and cell pitch of the SiC BJT.

Referring now in particular to the method of manufacturing a SiC BJT according to the first aspect of the present disclosure, the intermediate region may be formed according to the following processing procedure. At least part of the base region located in the passive part of the base region may be removed and a layer of semiconductor material (from which the intermediate region is to be made) may be provided on top of the BJT. Then, the layer of semiconductor material provided on top of the emitter region is removed. As a result, the passive part of the base region is replaced by the newly provided semiconductor layer, i.e. the intermediate region. The doping level and the size of the intermediate region may be adapted to the intended application of the SiC BJT.

Alternatively, the intermediate region may be formed by providing a layer of semiconductor material on top of the collector region and removing the layer of semiconductor material at a location corresponding to the active part of the base region and the emitter region. Further details about these two alternatives will be described in the following description.

In the SiC BJT, the intermediate region is arranged to replace a part of the passive region of the base layer. The intermediate region extends vertically from the surface of the base layer towards the collector region. Thus, in for instance the embodiment based on adjustment of the doping level of the intermediate region to e.g. at least $1 \times 10^{18}$ cm$^{-3}$, the doping level of the semiconductor material at the surface of the passive region of the base layer (i.e. at the level of the emitter-base junction) is at least $1 \times 10^{18}$ cm$^{-3}$.

Generally, in the present application, effects and features associated with the SiC BJT as defined in accordance with the second aspect of the present disclosure and its embodiments are largely analogous to those described in connection with the method according to the first aspect of the present disclosure. It will therefore be appreciated that any features in embodiments described with reference to the method according to the first aspect of the disclosure can be combined with the SiC BJT according to the second aspect of the disclosure and, vice versa, to create embodiments other than those described herein.

Further features of, and advantages with, the present disclosure will become apparent when studying the following detailed disclosure, the drawings and the appended claims. It will be appreciated that different features of the present disclosure can be combined to create embodiments other than those described in the following.

With reference to FIG. 1, an embodiment of the present disclosure is described.

FIG. 1 shows a SiC BJT 100 comprising a collector region 120, a base region 140 and an emitter region 160 arranged on a substrate 110, the base region 140 being arranged between the collector region 120 and the emitter region 160.

More specifically, FIG. 1 shows a schematic cross-section of a vertical (NPN) BJT 100 wherein the collector region 120, the base region 140 and the emitter region 160 are stapled on top of each other. The BJT 100 comprises also a collector contact 125 for electrically connecting the collector region 120, a base contact 145 for electrically connecting the base region 140 and an emitter contact 165 for electrically connecting the emitter region 160.

A vertical BJT comprises two pn junctions, one at the boundary between the collector region 120 and the base region 140, also referred to as the collector-base junction in the present application, and another one at the boundary between the base region 140 and the emitter region 160, also referred to as the base-emitter junction in the present application. The collector-base junction and the base-emitter junction are two sensitive (active) regions of the BJT.

Under forward conditions, a positive voltage is applied to the base-emitter junction such that free carriers (electrons in the case of a NPN BJT) are injected from the emitter region into the base region 140. In a NPN BJT, as the base 140 is made of p-doped material wherein the positive charge carriers (or holes) are the majority carriers, the electrons are called the minority carriers. As the BJT operates in its on-state (often referred to as saturation) with a sufficiently large base current to obtain a low forward voltage drop ($V_{CESAT}$), the collector-base junction is forward-biased such that holes are injected from the base region 140 into the collector region 120. In addition, the base-emitter junction is forward biased and electrons injected from the emitter region 160 into the base region 140 diffuse through the base region 140 and reach the collector region 120. Thus, the design of the BJT allows for injection of both electrons and holes into the collector region 120 causing an accumulation of carriers in the collector region 120 and thereby conductivity modulation.

In the present application, the term "vertical" generally refers to the direction of growth of the layers or regions forming the BJT during the manufacturing of the BJT, wherein the collector layer 120, the base layer 140 and the emitter layer 160 are grown, in this order, on top of each other.

For enabling the control of the extent of conductivity modulation in the collector region 120, the BJT 100 comprises an intermediate region 180 of semiconductor material arranged between the base-emitter junction (or edge 162 of the emitter region 160 as shown in the drawings) and a contact zone 145 for electrically contacting the base region 140. In other words, the intermediate region 180 is arranged between an edge 162 of the base-emitter junction and an edge of the contact zone 145 for electrically contacting the base region 140, i.e. in the passive part of the base region 140 (i.e. the part of the base region not interfacing the emitter region 160).

It will be appreciated that although the intermediate region 180 is shown in FIG. 1 not to extend longer than the edge of the base contact 145 closest to the emitter edge 162, it is envisaged (as will be further illustrated in FIGS. 6e and 7d) that the intermediate region may extend under the base contact 145.

With reference to FIG. 1, the (lateral) size of the intermediate region 180 is denoted as W, which then corresponds to the distance between an edge or a side 162 of the base-emitter junction and the base contact 145. The lateral size is defined to be in a direction substantially perpendicular to the direction of growth of the layers on the substrate 110.

In the vertical direction (i.e. along the direction of growth of the layers of the device), the intermediate region 180 is arranged to extend from the surface of the BJT (i.e. the surface of the base layer 140 uncovered by the emitter region 160, which surface corresponds to the vertical level of the base-emitter junction) towards the collector region 120. As will be further described in connection to FIGS. 6 and 7 below, the intermediate region 180 extends preferably through the base layer 140 to reach the collector region 120. In other words, the intermediate region 180 constitutes part of the passive region of the base layer 140.

According to the present disclosure, the extent of conductivity modulation in the collector region 120 is determined by adjusting at least one parameter of the intermediate region 180 affecting the diffusion current of minority carriers in the intermediate region 180. In the case of a NPN BJT, the intermediate region 180 is configured to determine the diffusion current of electrons from the intrinsic part of the base region 140 to the base contact 145.

In the present application, the parameters of the intermediate region 180 affecting the diffusion current of minority carriers in the intermediate region 180 are generally physical parameters of the intermediate region 180 such as the size or width and the doping concentration, as will be further described with reference to FIGS. 2-5. In particular, a reduction of the diffusion current of the minority carriers in the intermediate region 180 results in an increase of the conductivity modulation in the collector region 120 since less of the carriers injected from the emitter region 160 into the base region 140 become involved in a recombination process at the base contact 145. Still referring to the vertical BJT 100 described with reference to FIG. 1, the reduction of the diffusion current of minority carriers in the intermediate region 180 reduces the lateral extraction of minority carriers from the base region 140 to the base contact 145, thereby increasing the vertical injection of carriers and the amount of conductivity modulation in the collector region 120.

Turning now to the processing of a SiC BJT 100 such as described with reference to FIG. 1, in an exemplifying but non-limited embodiment, a low-resistive n-type doped (normally 3-inch or 4-inch) wafer of SiC (e.g. 4H—SiC) may be used as starting material, i.e. as the substrate 110. The device process may be based on an epitaxially grown NPN structure wherein the collector region 120 is made of n-doped semiconductor material, the base region 140 is made of p-doped semiconductor material and the emitter region 160 is made of n-doped semiconductor material. The respective doping concentrations for a SiC BJT are normally in the order of $10^{15}$ cm$^{-3}$ for the collector region 120 with a thickness of about 10-20 μm, $10^{17}$ cm$^{-3}$ for the base region 140 having a thickness of about 300 nm to 1 μm, and $10^{19}$ cm$^{-3}$ for the emitter region 530 having a thickness of about 500 nm to 2 μm.

Ohmic contacts 125 and 165 may be fabricated to the n-type doped emitter and collector regions 120 and 140, respectively, by depositing nickel followed by annealing at a temperature in the range of 800-1100° C. An ohmic contact to the p-type base region 140 may be fabricated by annealing an alloy consisting of Aluminum (Al), at temperatures in the same range as that used for formation of the nickel contacts. Al may be deposited on top of the base and emitter contacts 145 and 165, respectively, for reducing the series resistance in the metallization and allowing wire bonding to the top side of the chip. A metal system comprising nickel and gold may be deposited to the backside of the chip to make it compatible with conventional die attach technology.

A separate step of aluminum ion implantation may also be used to provide a low-resistive base contact, and to form a junction termination extension (JTE) with high voltage blocking capability. The JTE implantation dose is preferably in the order of $10^{13}$ cm$^{-2}$ to obtain improved blocking capability. Annealing for activation of implanted dopant atoms may be performed at temperatures in the range of 1600° C. to 1700° C. Surface passivation of the device 100 may also be performed by thermal oxidation of SiC under improved conditions for achieving low defect concentrations at the interface between SiC and the SiO$_2$ surface passivation layer.

Turning now to FIGS. 2-5, two more specific design concepts for controlling the extent of conductivity modulation in the collector region of a SiC BJT will be described.

Figure 2:
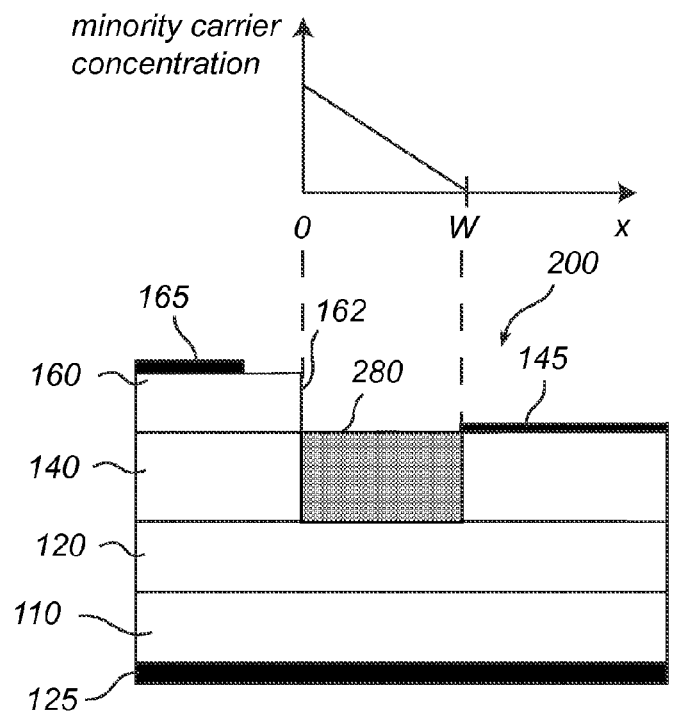
FIG. 2 schematically shows a cross-section of a SiC BJT with an intermediate region providing a larger distance between the base-emitter junction and the base contact than that shown in FIG. 1, in accordance with an embodiment.

With reference to FIG. 2, in accordance with an embodiment of the present disclosure, a design concept for controlling the extent of conductivity modulation based on a variation or adjustment of the size of the intermediate region is described.

FIG. 2 schematically shows a cross-section of a SiC BJT 200 which is identical to the SiC BJT 100 described with reference to FIG. 1 except that the intermediate region 280 provides a larger distance W between the base-emitter junction and the base contact 145 than the intermediate region 180 shown in FIG. 1.

FIG. 2 illustrates also the concentration of minority carriers, i.e. the electron concentration for a NPN transistor, as a function of the lateral size of the intermediate region 280, which size corresponds to the closest distance W between the emitter 160 (or base-emitter junction) and the base contact 145. In this respect, it is considered that the electron concentration at the base contact interface, i.e. at x=W as denoted in FIG. 2, reaches its equilibrium value, which is assumed to be negligible (i.e. very well approximated by zero) since carrier recombination at the ohmic contact is very high. Further, the electron concentration at the emitter edge or edge 162 of the base-emitter junction, i.e. at x=0 as denoted in FIG. 2, can be determined according to the following equation:

$$n(0) \sim \exp\left(\frac{q \times V_{BE}}{k \times T}\right), \qquad \text{equation 1}$$

wherein n(0) is the electron concentration at x=0 as defined above, q is the magnitude of the electrical charge of an electron with a value of $1.6 \times 10^{-19}$ C, $V_{BE}$ is the voltage applied between the base region 140 and the emitter region 160, k is the Boltzmann constant ($1.38 \times 10^{-23}$ J·K$^{-1}$) and T is the temperature.

As the gradient of electron concentration and the electron diffusion current are directly proportional, the electron diffusion current is inversely proportional to the distance between the emitter edge at x=0 and the base contact at x=W (assuming that surface recombination or bulk recombination is not large enough to significantly reduce the diffusion length).

Referring now to FIG. 1, the electron concentration through the intermediate region 180, i.e. as a function of the distance between the emitter edge 162 and the base contact 145, is also represented. According to this specific design concept, comparing FIGS. 1 and 2, the electron diffusion current in the intermediate regions 180 and 280, respectively, depends on the distance W between the emitter edge 162 and the edge of the base contact 145. In particular, the longer distance shown in FIG. 2 reduces the lateral electron diffusion current, which in turn reduces the lateral extraction of electrons and thereby increases the vertical electron injection and the amount of conductivity modulation in the collector region 120.

Depending on the intended application, taking into account the tradeoff between power losses associated with the conduction and the switching properties of the SiC BJT, the size of the intermediate region can be adjusted during the manufacturing of the BJT for determining the extent of conductivity modulation in the device.

Figure 3:
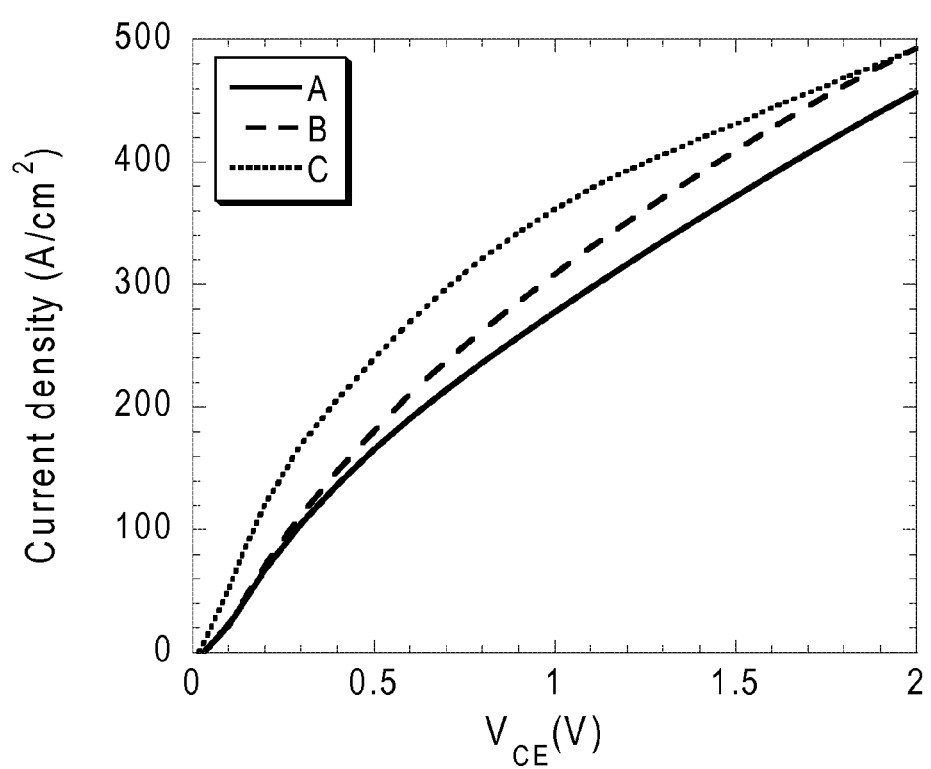
FIG. 3 shows, for a base current density of 10 A/cm$^2$, simulated collector current densities (curves A, B and C) as a function of the voltage applied between the collector region and the emitter region for intermediate regions providing distances between the base-emitter junction and the base contact of 2, 4 and 8 micrometers, respectively.

To further illustrate the effect of the lateral size (or width) of the intermediate region, FIG. 3 shows a comparison of simulated I-V characteristics A, B and C at a temperature of 150° C. with a base current ($I_B$) of 10 A/cm$^2$ for identical SiC BJTs except that the intermediate regions provide distances W between the base-emitter junction and the base contact of 2, 4 and 8 µm (micrometers), respectively. The results of the simulations show that a forward voltage drop ($V_{CESAT}$) at a normal operating forward current density of 250 A/cm$^2$ is 0.52 V for a distance of 8 µm (curve C), which is 40% less than the forward voltage drop ($V_{CESAT}$=0.87 V) for a distance of 2 µm (curve A). The design concept based on an adjustment of the lateral size of the intermediate region is therefore efficient in determining the extent of conductivity modulation. According to this design concept, the extent or amount of conductivity modulation can be increased by providing an intermediate region increasing the distance between the emitter edge 162 and the base contact 145.

Figure 4:
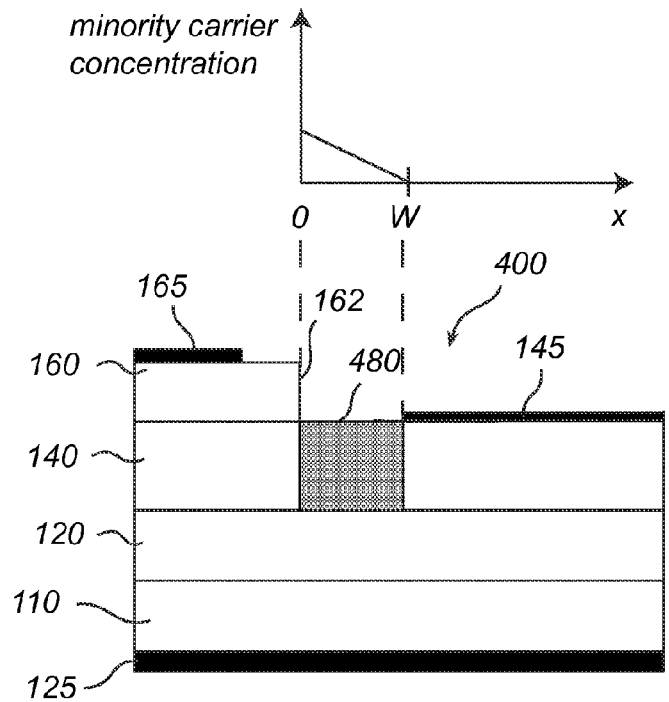
FIG. 4 schematically shows a cross-section of a SiC BJT illustrating the effect of the doping level of the intermediate region in accordance with an embodiment.

With reference to FIG. 4, in accordance with another embodiment of the present disclosure, a design concept for controlling the extent of conductivity modulation based on a variation or adjustment of the doping level of the intermediate region is described.

FIG. 4 schematically shows a cross-section of a SiC BJT 400 which is identical to the SiC BJT 100 described with reference to FIG. 1 except that the doping level of the intermediate region 480 is significantly higher than the doping level of the intermediate region 180 shown in FIG. 1 and, in particular, higher than the doping level of the active part of the base layer 140 interfacing the emitter region 160 for forming the base-emitter junction.

In both the SiC BJT 100 and the SiC BJT 400 described with reference to FIGS. 1 and 4, respectively, the doping level in the part of the base region 140 interfacing the emitter region 160 remains unchanged and is in the range of $5 \times 10^{17}$ cm$^{-3}$ since the doping level of this part of the base region affects the normal operation of the SiC BJT (i.e. the required bias conditions for obtaining conduction or blocking of a current).

In its turn, the doping level of the intermediate region 480 may be at least $1 \times 10^{18}$ cm$^{-3}$. In particular, the doping level of the intermediate region 480 is higher than the doping level of the active region of the base layer 140 and also higher than the doping level of the collector region 120.

FIG. 4 illustrates also the concentration of minority carriers, in this case the electron concentration, as a function of the lateral size of the intermediate region 480, which size corresponds to the closest distance between the emitter region 160 (or base-emitter junction) and the base contact 145. In this representation, the electron concentration at the base contact interface reaches its equilibrium value, which is assumed to be negligible (i.e. very well approximated by zero) since carrier recombination at the ohmic contact 145 is very high. Further, the electron concentration at the emitter edge or edge 162 of the base-emitter junction, i.e. at x=0 as denoted in FIG. 4, can be determined according to the following equation:

$$n(0) \sim \left(\frac{n_i^2}{N_A}\right) \times \exp\left(\frac{q \times V_{BE}}{k \times T}\right), \quad \text{equation 2}$$

wherein n(0) is the electron concentration at x=0 as defined above, $n_i$ is the intrinsic carrier concentration, $N_A$ is the local acceptor concentration, q is the magnitude of the electrical charge of an electron with a value of $1.6 \times 10^{-19}$ C, $V_{BE}$ is the voltage applied between the base region and the emitter region, k is the Boltzmann constant ($1.38 \times 10^{-23}$ J·K$^{-1}$) and T is the temperature.

As compared to the electron concentration represented in FIG. 1 wherein the doping level in the intermediate region 180 is the same (or nearly the same) as in the active part of the base region 140, the increase in doping concentration of the intermediate region 480 in the BJT described with reference to FIG. 4 decreases the concentration of minority carriers (electrons) at x=0. As a result, the gradient of electron concentration (represented by the slope or derivative of the line shown on the graph of FIG. 4) is decreased. An increased doping concentration in the intermediate region reduces the electron concentration in this region with a factor equal to the relative increase in doping concentration in the intermediate region.

This specific design concept is efficient in that, as illustrated by a comparison of FIGS. 1 and 4, the gradient of electron concentration, and thus the electron diffusion current, is controlled by adjusting the doping concentration in the intermediate region 480. In particular, a higher doping level as shown in FIG. 4 reduces the lateral electron diffusion current, which in turn reduces the lateral extraction of electrons and thereby increases the vertical electron injection and the amount of conductivity modulation in the collector region 120.

Figure 5:
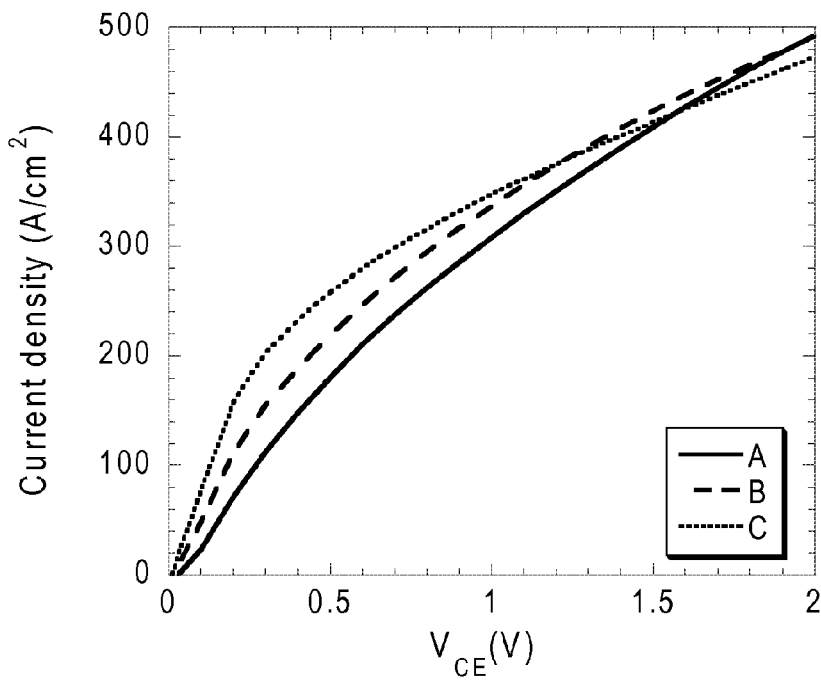
FIG. 5 shows, for a base current density of 10 A/cm$^2$ and an assumed temperature of 150° C., the simulated collector current densities (curves A, B and C) as a function of the voltage applied between the collector region and the emitter region for intermediate regions providing a distance between the base-emitter junction and the base contact of 4 µm having a doping level equal to $5 \times 10^{17}$ cm$^{-3}$ (standard base doping level), $5 \times 10^{18}$ cm$^{-3}$ and $5 \times 10^{19}$ cm$^{-3}$, respectively.

To further illustrate the effect of the doping concentration of the intermediate region 480 in a SiC BJT, FIG. 5 shows a comparison of simulated I-V characteristics A, B and C at a temperature of 150° C. with a base current ($I_B$) of 10 A/cm$^2$ for identical SiC BJTs except that the doping levels in the intermediate region are equal to a standard doping level ($5 \times 10^{17}$ cm$^{-3}$) of an epitaxially grown base region 140, $5 \times 10^{18}$ cm$^{-3}$ and $5 \times 10^{19}$ cm$^{-3}$, respectively. In the example of FIG. 5, the intermediate regions provide a distance between the edge 162 of the emitter region 160 and the base contact 145 of 4 micrometers in all three simulated cases.

The results of the simulations show that a forward voltage drop ($V_{CESAT}$) at a normal operating forward current density of 250 A/cm² is 0.46 V for an extrinsic doping concentration of $5\times10^{19}$ cm$^{-3}$ of the intermediate region 480, which is 38% less than the forward voltage drop ($V_{CESAT}$=0.74 V) for the case of a standard doping concentration in the range of $5\times10^{17}$ cm$^{-3}$.

According to this design concept, the extent or amount of conductivity modulation can be increased by increasing the doping level in the intermediate region 480 of the SiC BJT 400.

Depending on the intended application, taking into account the tradeoff between power losses associated with the conduction and the switching properties of the BJT 400, the doping concentration of the intermediate region 480 is adjusted during the manufacturing of the BJT for determining the extent of conductivity modulation.

According to an embodiment, both the size of the intermediate region of the SiC BJT and its doping concentration may be adjusted for determining the amount of conductivity modulation in the SiC BJT. In this respect, it is worth noting that determining the extent of conductivity modulation based on an adjustment of the doping level of the intermediate region is advantageous over the design concept based on adjustment of the size of the intermediate region in that it does not require any variation of the total size (or so-called cell pitch) of the BJT. Thus, the design concept described with reference to FIGS. 4 and 5 is more compatible with either a standard cell pitch or even a smaller total cell pitch than the design concept described with reference to FIGS. 1-3.

With reference to FIGS. 6 and 7, two separate sequences of processing steps for the fabrication of an intermediate region according to the above are described.

FIGS. 6a-6d show a process flow illustrating a method of forming an intermediate region in a SiC BJT in accordance with an exemplifying embodiment of the present disclosure.

Figure 6A:
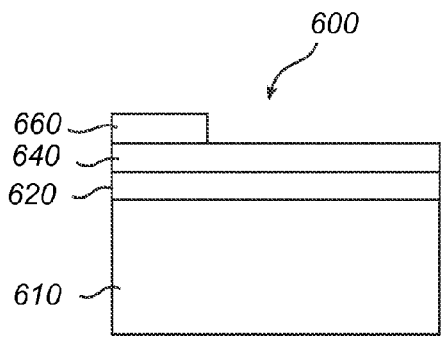
FIGS. 6a-6e show a process flow illustrating a method of forming an intermediate region in a SiC BJT in accordance with an exemplifying embodiment.

As shown in FIG. 6a, the initial starting point for manufacturing the intermediate region of the SiC BJT is a structure 600 wherein a collector region 620, a base region 640 and an emitter region 660 have been provided, for example by epitaxial growth, on a substrate 610. The emitter region 660 may have been formed by epitaxial growth of an emitter layer on top of the base layer followed by a step of patterning, using photolithography techniques (such as optical photolithography, electron-beam lithography, X-ray lithography, ion-beam lithography, nanoimprint lithography, or any kind of lithography techniques of the semiconductor technology), for defining the area corresponding to the emitter region 660 on top of the base region 640. Then, a step of etching is performed for removing the part of the emitter layer unprotected by the pattern, i.e. the part of the emitter layer not intended to form the base-emitter junction.

Figure 6B:
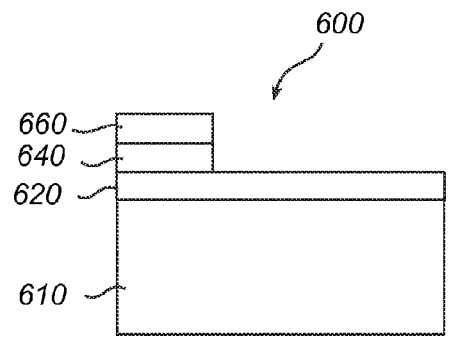

As shown in FIG. 6b, the next step is then to remove (for instance by reactive ion etching) the part of the base layer not intended to form the base-emitter junction, i.e. the part of the base layer not located directly under the emitter region 660. Such a removal step may include sub-steps of patterning the surface of the structure and etching the part of the surface unprotected by the pattern.

Figure 6C:
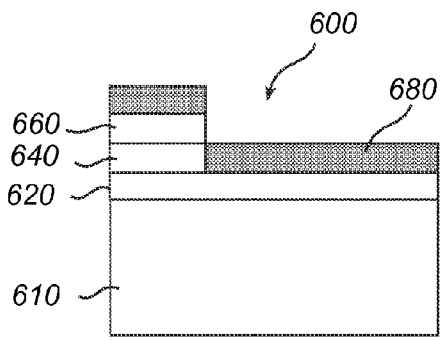
Figure 6D:
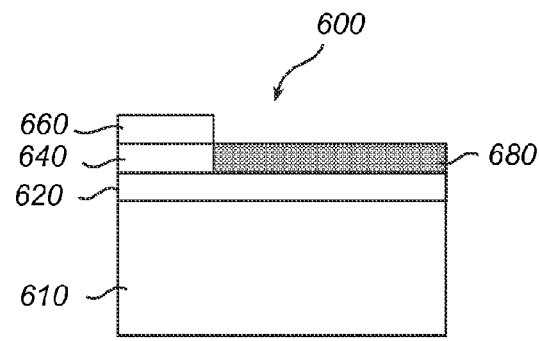

Further, as illustrated in FIG. 6c, a layer made of a semiconductor material intended to form the intermediate region 680 is provided on the surface of the whole structure 600. The material for the intermediate region is advantageously the same as the material used for the other layers of the BJT and the type of doping (i.e. n-type or p-type) is the same as that of the part of the base region interfacing the emitter region. The layer may be epitaxially grown or deposited (for instance by CVD epitaxy) and its doping level is selected in accordance with the amount of conductivity modulation desired in the BJT. As the layer is deposited or grown on the whole surface of the semiconductor structure 600, the next step depicted in FIG. 6d is to remove the part of the layer deposited or grown on top of the emitter region 660 using sub-steps of patterning and etching techniques such as described above.

Figure 6E:
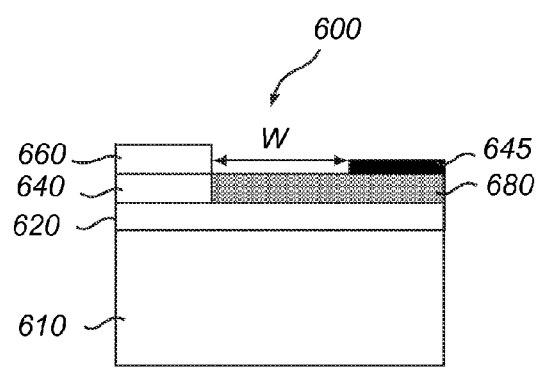

An intermediate region 680 arranged on the side of the base region 640 and on top of the collector region 620 is thereby provided. To further define the intermediate region 680 and its influence on the extent of conductivity modulation in the BJT 600, the base contact 645 is designed to be arranged at a specific distance W from the base-emitter junction, as represented in FIG. 6e.

FIGS. 7a-7d show an alternative process flow illustrating a method of forming an intermediate region in a SiC BJT in accordance with another exemplifying embodiment of the present disclosure.

Figure 7A:
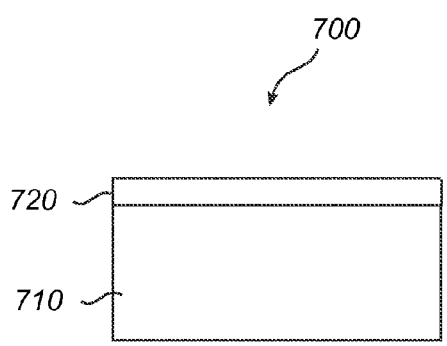
FIGS. 7a-7d show a process flow illustrating a method of forming an intermediate region in a SiC BJT in accordance with another exemplifying embodiment.
Figure 7B:
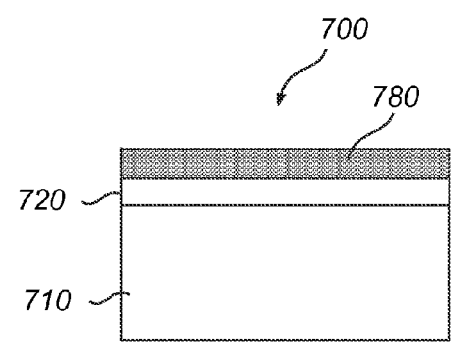

As shown in FIG. 7a, the initial starting point for manufacturing the intermediate region of the SiC BJT is a structure 700 wherein a collector region 720 has been provided, for example by epitaxial growth, on a substrate 710. Then, as shown in FIG. 7b, a layer made of a semiconductor material intended to form the intermediate region 780 is provided on top of the collector region (i.e. on the surface of the whole structure 700). This layer 780 may be epitaxially grown or deposited and its doping level is selected in accordance with the amount of conductivity modulation desired in the BJT.

Figure 7C:
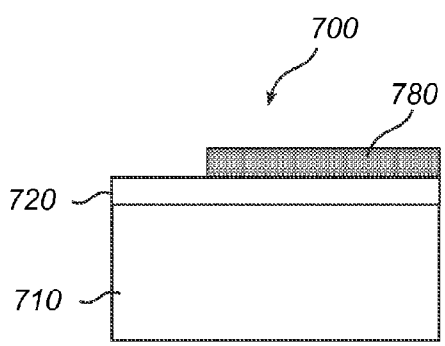

As the layer is deposited on the whole surface of the semiconductor structure, the next step depicted in FIG. 7c is to remove the part of the layer deposited or grown at a location where the base region 740 and the emitter region 760 are intended to be located. Removal of the layer 780 may be performed using sub-steps of patterning and etching techniques such as described above.

Figure 7D:
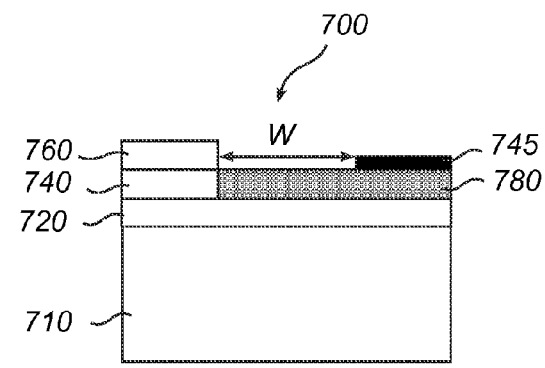

The base region 740 and the emitter region 760 may then be formed by epitaxial growth of a base layer followed by epitaxial growth of an emitter layer. As the base and emitter layers may be provided on top of the whole surface 700, either protection of the intermediate structure 780 before deposition or growth of these layers or a sequence of patterning and etching steps subsequent to the deposition or growth of these layers may be performed such that the intermediate region 780 is free from material used for the base and emitter regions 740 and 760. The resulting structure 700 is shown in FIG. 7d, wherein the base contact 745 designed to be arranged at a specific distance W from the base-emitter junction is also represented. The distance W further determines the influence on the extent of conductivity modulation in the BJT 700, as described above.

While specific embodiments have been described, the skilled person will understand that various modifications and alterations are conceivable within the scope as defined in the appended claims.

For example, although the parameters affecting the diffusion current of minority carriers in the intermediate region have been described to be the size of the intermediate region and its doping level, it is also envisaged that the diffusion current of the minority carriers may be affected by providing an intermediate region made of another material than SiC.

Further, although the present disclosure has merely been described with reference to a vertical NPN BJT, the concepts underlying the present disclosure are equally applicable to a vertical PNP BJT wherein at least one of the parameters affecting the diffusion current of positive charge carriers (holes) in an intermediate region arranged between the base-emitter junction and the base contact may be adjusted for determining the extent of conductivity modulation in the collector region of the PNP BJT. For a PNP BJT, the minority carriers in the base region are positive charge carriers (holes) and the intermediate region is doped with a donor.

VARIOUS EMBODIMENTS

This enumeration of embodiments is a non-inclusive list of embodiments. In other words, other embodiments that are described in the detailed description are possible and combinations of features can vary from those enumerated below.

1. A method of manufacturing a silicon carbide bipolar junction transistor (100), BJT, comprising a collector region (120), a base region (140) and an emitter region (160), wherein said method comprises the step of:
providing an intermediate region (180) of semiconductor material arranged between the base-emitter junction, said base-emitter junction being formed by the base region and the emitter region, and a contact zone (145) for electrically contacting the base region wherein the extent of conductivity modulation in the collector region is determined by adjusting at least one parameter of the intermediate region affecting the diffusion current of minority carriers in the intermediate region.

2. The method of item 1, wherein the intermediate region is arranged in the passive part of the base region.

3. The method of item 1 or 2, wherein the intermediate region is arranged between an edge (162) of the base-emitter junction and an edge of the contact zone for electrically contacting the base region.

4. The method of any one of the preceding items, wherein a parameter affecting the diffusion current of minority carriers is the size (W) of the intermediate region, said size corresponding to the distance between an edge (162) of the base-emitter junction and an edge of the contact zone for electrically contacting the base region.

5. The method of any one of the preceding items, wherein a parameter affecting the diffusion current of minority carriers is the doping level of the semiconductor material of the intermediate region.

6. The method of any one of the preceding items, wherein the intermediate region is formed according to the following processing steps:
removing at least part of the base region located in the passive part of the base region;
providing a layer of semiconductor material on top of the BJT; and
removing the layer of semiconductor material provided on top of the emitter region.

7. The method of any one of items 1-5, wherein the intermediate region is formed according to the following processing steps:
providing a layer of semiconductor material on top of the collector region; and
removing the layer of semiconductor material at a location corresponding to the base and emitter regions.

8. A silicon carbide bipolar junction transistor (100), BJT, comprising a collector region (120), a base region (140) and an emitter region (160), wherein said BJT comprises an intermediate region (180) of semiconductor material arranged between the base-emitter junction, said base-emitter junction being formed by the base region and the emitter region, and a contact zone for electrically contacting the base region, wherein at least one parameter of the intermediate region affecting the diffusion current of minority carriers in the intermediate region is configured to determine the extent of conductivity modulation in the collector region.

9. The BJT of item 8, wherein the intermediate region is provided in the passive part of the base region.

10. The BJT of item 8 or 9, wherein the intermediate region is arranged between an edge (162) of the base-emitter junction and an edge of the contact zone for electrically contacting the base region.

11. The BJT of any one of items 8-10, wherein a parameter determining the extent of the conductivity modulation in the collector region is the size (W) of the intermediate region, said size corresponding to the distance between an edge (162) of the base-emitter junction and an edge of the contact zone for electrically contacting the base region.

12. The BJT of any one of items 8-11, wherein a parameter for determining the extent of conductivity modulation in the collector region is the doping level of the semiconductor material of the intermediate region.

13. The BJT of item 11, wherein the distance between the base-emitter junction and the contact zone for electrically contacting the base region is at least 5 micrometers.

14. The BJT of any one of items 8-13, wherein the doping level of the semiconductor material of the intermediate region is at least $1 \times 10^{18}$ cm$^{-3}$.

15. The BJT of any one of items 8-14, being a vertical BJT and a parameter for determining the extent of conductivity modulation is the lateral width of the intermediate region.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A silicon carbide bipolar junction transistor (BJT) comprising:
   a collector region;
   a base region on the collector region;
   an emitter region on the base region;
   a base contact electrically contacting the base region, the base region having an intrinsic part interfacing the emitter region; and
   an intermediate region of semiconductor material having a doping level at an edge of a junction of the base region and the emitter region that is higher than a doping level of the intrinsic part of the base region.

2. The BJT of claim 1, wherein the intermediate region is disposed in a passive part of the base region.

3. The BJT of claim 1, wherein a lateral size of the intermediate region corresponds to at least a distance from an edge of the intrinsic part of the base region to an edge of the base contact.

4. The BJT of claim 3, wherein the distance between the edge of the intrinsic part of the base region and the edge of the base contact is at least 5 micrometers.

5. The BJT of claim 1, wherein the doping level of the semiconductor material of the intermediate region is at least $1 \times 10^{18}$ cm$^{-3}$.

6. The BJT of claim 1, wherein the doping level of the semiconductor material of the intermediate region is in a range of $5 \times 10^{18}$ cm$^{-3}$ to $1 \times 10^{20}$ cm$^{-3}$.

7. A silicon carbide bipolar junction transistor (BJT) comprising:
   a collector region;
   a base region;
   an emitter region;
   a contact zone electrically contacting the base region, the base region having an intrinsic part interfacing the emitter region; and
   an intermediate region of semiconductor material having at least a portion disposed between the intrinsic part of the base region and the contact zone, the portion of the intermediate region having a doping level higher than a doping level of the intrinsic part, the higher doping level of the portion of the intermediate region extending from an edge of the emitter region toward the contact zone.

8. The BJT of claim 7, wherein the doping level of the intermediate region is at least $1 \times 10^{18}$ cm$^{-3}$.

9. The BJT of claim 7, wherein the semiconductor material of the intermediate region has a doping level in a range of approximately $5 \times 10^{18}$ cm$^{-3}$ to $1 \times 10^{20}$ cm$^{-3}$.

10. The BJT of claim 7, wherein a lateral size of the intermediate region corresponding to at least a distance from an edge of the intrinsic part of the base region to an edge of the contact zone is at least 5 micrometers.

11. A silicon carbide bipolar junction transistor (BJT) comprising:
    a collector region;
    a base region on the collector region;
    an emitter region on the base region, the base region having an intrinsic part interfacing the emitter region;
    a base contact electrically contacting the base region; and
    an intermediate region of semiconductor material extending from an edge of the emitter region to the base contact, the intermediate region having a doping level at an edge of a junction between the intrinsic part of the base region and the intermediate region that is higher than a doping level of the intrinsic part of the base region.

12. The BJT of claim 11, wherein the intermediate region is disposed in a passive part of the base region.

13. The BJT of claim 11, wherein the doping level of the intermediate region is at least $1 \times 10^{18}$ cm$^{-3}$.

14. The BJT of claim 11, wherein the doping level of the intermediate region is in a range of $5 \times 10^{18}$ cm$^{-3}$ to $1 \times 10^{20}$ cm$^{-3}$.

15. The BJT of claim 11, wherein a lateral size of the intermediate region corresponds to at least a distance from the edge of the intrinsic part of the base region to an edge of the base contact.

16. The BJT of claim 11, wherein the intermediate region corresponds to a portion of a layer of semiconductor material arranged in at least part of the base region in a passive part of the base region.

17. The BJT of claim 11, wherein the intermediate region corresponds to a portion of a layer of semiconductor material being different from the semiconductor material at a location corresponding to the base region and the emitter region.

18. The BJT of claim 1, wherein the intermediate region is in contact with the intrinsic part.

19. The BJT of claim 1, wherein the intermediate region of semiconductor material has at least a part extending from an edge of a junction of the base region and the emitter region to at least the base contact.

20. The BJT of claim 7, wherein the higher doping level of the portion of the intermediate region extends from a surface of the base region to the collector region.

* * * * *